United States Patent
Chiang et al.

(10) Patent No.: US 10,163,662 B2
(45) Date of Patent: Dec. 25, 2018

(54) FABRICATION METHOD OF SEMICONDUCTOR PACKAGE

(71) Applicant: Siliconware Precision Industries Co., Ltd., Taichung (TW)

(72) Inventors: Cheng-Chia Chiang, Taichung (TW); Don-Son Jiang, Taichung (TW); Lung-Yuan Wang, Taichung (TW); Shih-Hao Tung, Taichung (TW); Shu-Huei Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/478,508

(22) Filed: Apr. 4, 2017

(65) Prior Publication Data
US 2017/0207104 A1  Jul. 20, 2017

Related U.S. Application Data

(62) Division of application No. 14/255,326, filed on Apr. 17, 2014, now Pat. No. 9,646,921.

(30) Foreign Application Priority Data

Jan. 2, 2014  (TW) .............................. 103100019 A

(51) Int. Cl.
*H01L 21/56* (2006.01)
*H01L 23/00* (2006.01)
(Continued)

(52) U.S. Cl.
CPC .......... *H01L 21/563* (2013.01); *H01L 21/486* (2013.01); *H01L 21/4853* (2013.01); *H01L 23/3128* (2013.01); *H01L 23/3135* (2013.01); *H01L 23/49811* (2013.01); *H01L 23/49816* (2013.01); *H01L 23/5389* (2013.01); (Continued)

(58) Field of Classification Search
CPC ....... H01L 2924/00014; H01L 2924/00; H01L 2924/00012; H01L 2224/32225; H01L 2224/73265
See application file for complete search history.

(56) References Cited

U.S. PATENT DOCUMENTS

2010/0144101 A1* 6/2010 Chow ................... H01L 21/561
438/127
2013/0187268 A1  7/2013 Lin et al.
(Continued)

*Primary Examiner* — Tony Tran
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, which includes: a packaging substrate having opposite first and second surfaces and a plurality of first and second conductive pads formed on the first surface; a chip having opposite active and inactive surfaces and disposed on the first conductive pads via the active surface thereof; a plurality of conductive posts formed on the second conductive pads, respectively; and a first encapsulant formed on the first surface of the packaging substrate for encapsulating the chip and the conductive posts and having a plurality of openings for exposing upper surfaces of the conductive posts, thereby increasing the package density and protecting the chip and the interconnection structure from being adversely affected by intrusion of moisture.

13 Claims, 5 Drawing Sheets

(51) Int. Cl.
*H01L 23/31* (2006.01)
*H01L 23/498* (2006.01)
*H01L 21/48* (2006.01)
*H01L 23/538* (2006.01)

(52) U.S. Cl.
CPC .............. *H01L 24/81* (2013.01); *H01L 24/16* (2013.01); *H01L 2224/0401* (2013.01); *H01L 2224/05568* (2013.01); *H01L 2224/05647* (2013.01); *H01L 2224/131* (2013.01); *H01L 2224/13023* (2013.01); *H01L 2224/16225* (2013.01); *H01L 2224/16237* (2013.01); *H01L 2224/16238* (2013.01); *H01L 2224/32225* (2013.01); *H01L 2224/73204* (2013.01); *H01L 2224/81815* (2013.01); *H01L 2224/92125* (2013.01); *H01L 2924/14* (2013.01); *H01L 2924/18161* (2013.01)

(56) References Cited

U.S. PATENT DOCUMENTS

2014/0061903 A1 3/2014 Chen et al.
2014/0061951 A1 3/2014 Lee

\* cited by examiner

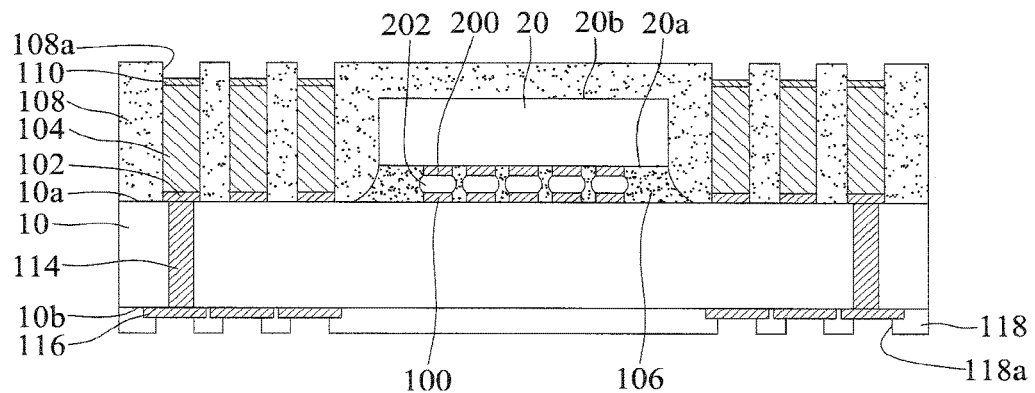
FIG.1D"
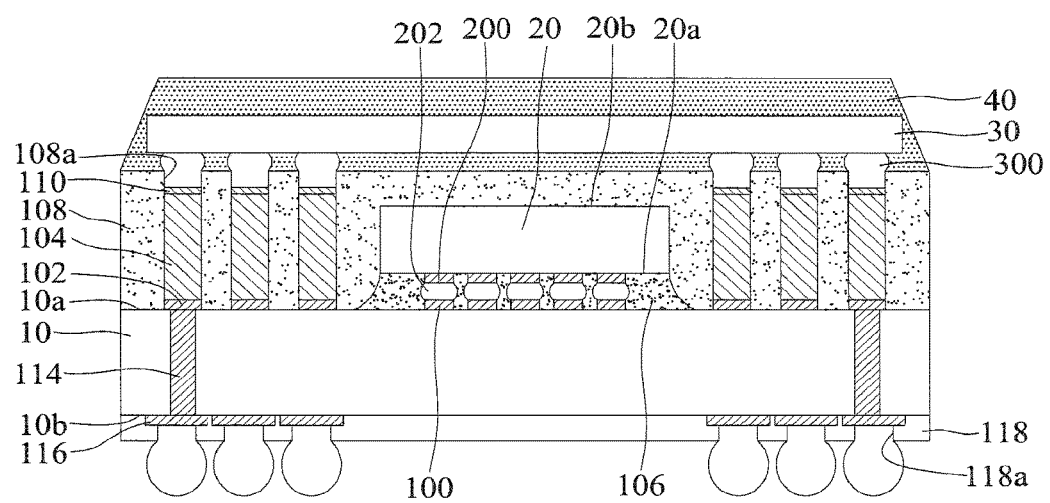
FIG.1G"

FABRICATION METHOD OF SEMICONDUCTOR PACKAGE

CROSS-REFERENCE TO RELATED APPLICATIONS

This application is a divisional of copending application U.S. Ser. No. 14/255,326, filed on Apr. 17, 2014, which claims under 35 U.S.C. § 119(a) the benefit of Taiwanese Patent Application No. 103100019, filed on Jan. 2, 2014, the entire contents of which are incorporated herein by reference.

BACKGROUND OF THE INVENTION

1. Field of the Invention

The present invention relates to semiconductor packages and fabrication methods thereof, and more particularly, to a semiconductor package having conductive posts and a fabrication method thereof.

2. Description of Related Art

In recent years, package on package (PoP) structures have become a focus since they meet the miniaturization requirement of electronic products by saving surface area of substrates and at the same time have an improved processing performance.

In a conventional PoP structure, solder balls serve as an interconnection structure for electrically connecting a lower packaging substrate and an upper electronic element. However, to prevent solder bridging during a reflow process, the pitch between the solder balls must be greater than 300 um. As such, the interconnection structure occupies a large area of the packaging substrate and limits the I/O density of the overall package structure.

Further, since the solder ball interconnection structure must be higher than chips on the substrate, the height of the PoP structure as well as the thickness of an electronic device having the PoP structure cannot be effectively reduced.

Furthermore, since no encapsulant is formed between the lower packaging substrate and the upper electronic element, the chips on the packaging substrate and the interconnection structure are susceptible to intrusion of moisture.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a packaging substrate having opposite first and second surfaces and a plurality of first and second conductive pads formed on the first surface; a chip having opposite active and inactive surfaces and disposed on the first conductive pads via the active surface thereof; a plurality of conductive posts formed on the second conductive pads, respectively; and a first encapsulant formed on the first surface of the packaging substrate for encapsulating the chip and the conductive posts and having a plurality of openings for exposing upper surfaces of the conductive posts.

The present invention further provides a method for fabricating a semiconductor package, which comprises the steps of: providing a packaging substrate having opposite first and second surfaces and a plurality of first and second conductive pads formed on the first surface; forming a plurality of conductive posts on the second conductive pads, respectively; displaying a chip having opposite active and inactive surfaces on the first conductive pads via the active surface thereof; forming a first encapsulant on the first surface of the packaging substrate for encapsulating the chip and the conductive posts; and removing upper portions the first encapsulant and the conductive posts such that upper surfaces of the first encapsulant and the conductive posts are flush with the inactive surface of the chip.

The present invention further provides another method for fabricating a semiconductor package, which comprises the steps of: providing a packaging substrate having opposite first and second surfaces and a plurality of first and second conductive pads formed on the first surface; forming a plurality of conductive posts on the second conductive pads, respectively; disposing on the first conductive pads a chip having opposite active and inactive surfaces via the active surface thereof; forming a first encapsulant on the first surface of the packaging substrate for encapsulating the chip and the conductive posts; and forming a plurality of openings in the first encapsulant for exposing upper surfaces of the conductive posts.

The semiconductor package of the present invention uses the conductive posts instead of the conventional solder balls as an interconnection structure for a PoP structure and the upper surfaces of the encapsulant and the conductive posts are flush with the inactive surface of the chip, thereby increasing the package density, reducing the package thickness and saving the surface area of the packaging substrate. Further, the encapsulant formed between the lower packaging substrate and an upper electronic element protects the chip and the interconnection structure from being adversely affected by intrusion of moisture.

BRIEF DESCRIPTION OF DRAWINGS

FIGS. 1F' and 1G' are schematic cross-sectional views showing another embodiment of FIGS. 1F and 1G; and FIGS. 1D" and 1G" are schematic cross-sectional views showing a further embodiment of FIGS. 1D and 1G.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention.

FIGS. 1A to 1G are schematic cross-sectional views showing a method for fabricating a semiconductor package according to the present invention.

Figure 1A:
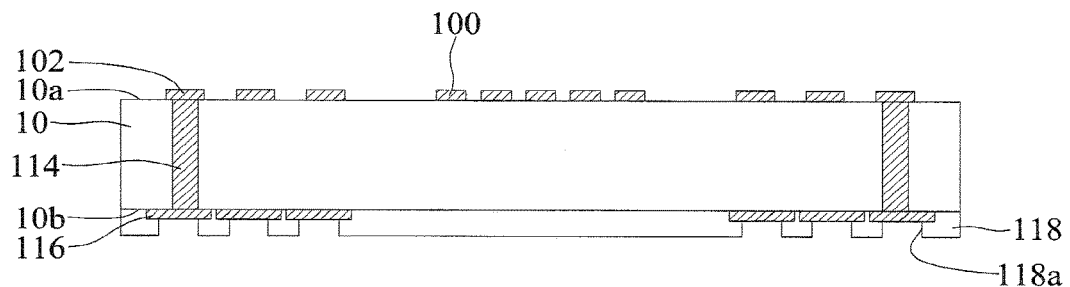
FIGS. 1A to 1G are schematic cross-sectional views showing a method for fabricating a semiconductor package according to the present invention.

Referring to FIG. 1A, a packaging substrate 10 is provided. The package substrate 10 has opposite first and second surfaces 10a, 10b and a plurality of first and second conductive pads 100, 102 formed on the first surface 10a. Further, the packaging substrate 10 can have a plurality of third conductive pads 116 formed on the second surface 10b of the packaging substrate 10 and a plurality of conductive through holes 114 formed between the second conductive pads 102 and the third conductive pads 116 and penetrating the packaging substrate 10 for electrically connecting the second conductive pads 102 and the third conductive pads 116. Furthermore, a solder mask layer 118 can be formed on the second surface 10b of the packaging substrate 10 and have a plurality of openings 118a for exposing the third conductive pads 116.

Figure 1B:
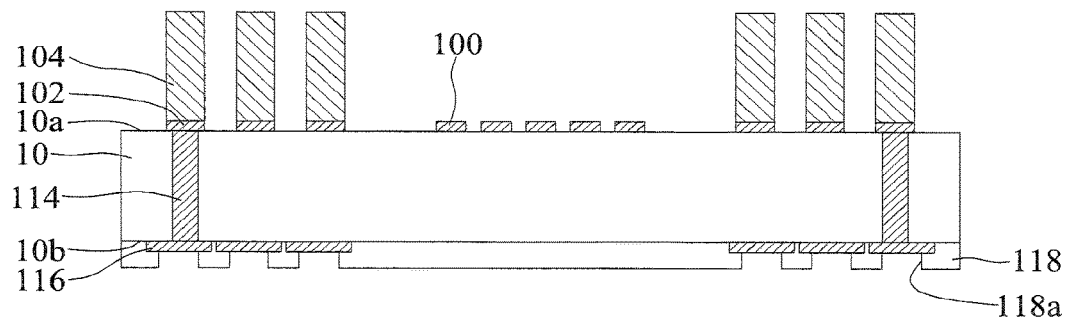

Referring to FIG. 1B, a plurality of conductive posts 104 are formed on the second conductive pads 102, respectively. The conductive posts 104 can be made of, but not limited to, copper.

Figure 1C:
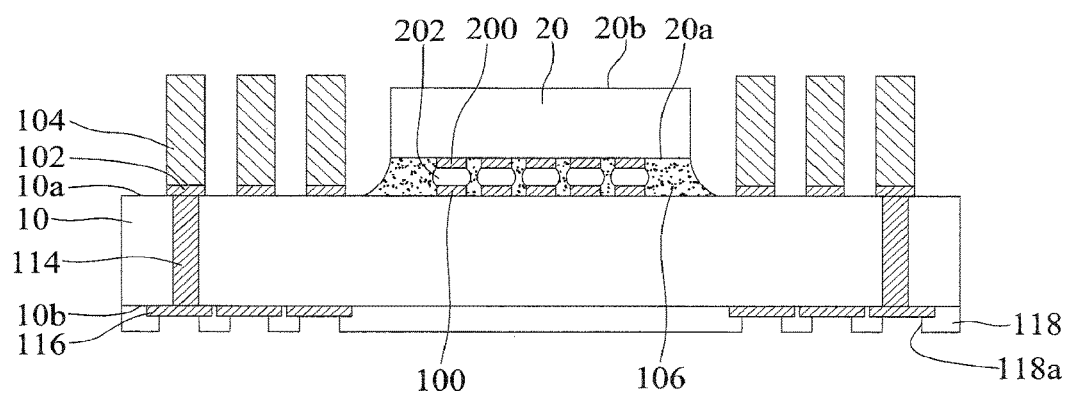

Referring to FIG. 1C, a chip 20 having opposite active and inactive surfaces 20a, 20b is provided and disposed on the first conductive pads 100 via the active surface 20a thereof. At this point, upper surfaces of the conductive posts 104 may be higher than the inactive surface 20b of the chip 20. In an embodiment, the active surface 20a of the chip 20 has a plurality of copper bumps 200 with a solder material 202 thereon. The solder material 202 is reflowed to electrically connect the copper bumps 200 of the chip 20 and the first conductive pads 100 of the packaging substrate 10, thereby flip-chip disposing the chip 20 on the first conductive pads 100. After the chip 20 is disposed on the first conductive pads 100, an underfill 106 can further be formed between the chip 20 and the packaging substrate 10 for encapsulating the first conductive pads 100, the solder material 202 and the copper bumps 200.

Figure 1D:
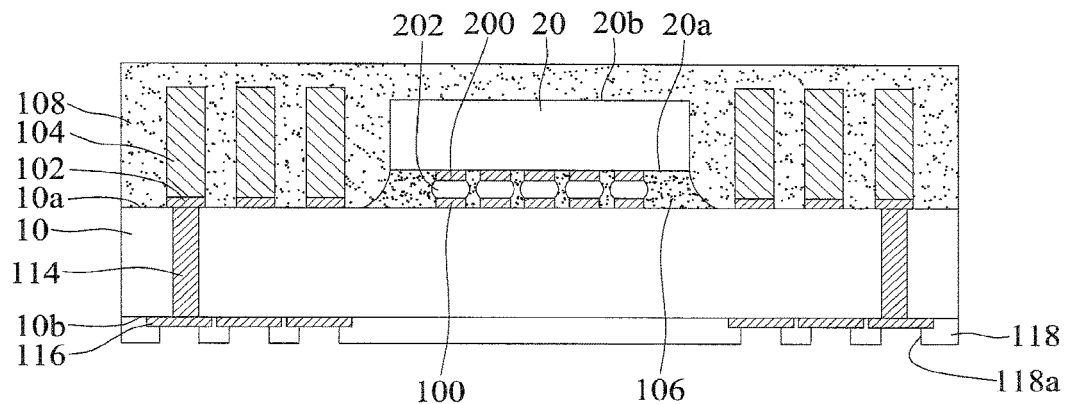

Referring to FIG. 1D, a first encapsulant 108 is formed on the first surface 10a of the packaging substrate 10 for encapsulating the chip 20 and the conductive posts 104.

Figure 1E:
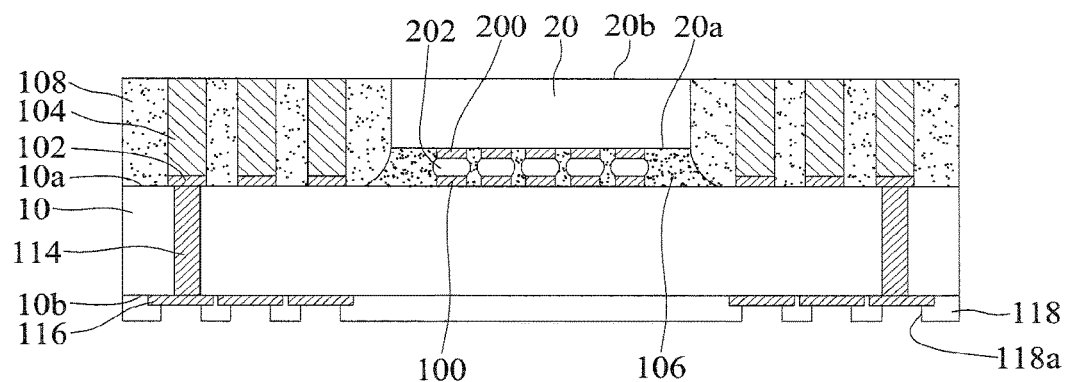

Referring to FIG. 1E, a portion of the first encapsulant 108 and a portion of the conductive posts 104 are removed such that upper surfaces of the first encapsulant 108 and the conductive posts 104 are flush with the inactive surface 20b of the chip 20. Also, a portion of the chip 20 can be removed. As such, the overall structure has a predetermined thickness. It should be noted that whether the conductive posts 104 or the chip 20 is partially removed is determined by which one of them is higher than the predetermined thickness. The removing method can be, but not limited to, brushing or grinding. Further, an insulating layer (not shown) can be formed on the first encapsulant 108 and have a plurality of openings for exposing the upper surfaces of the conductive posts 104.

Figure 1F:
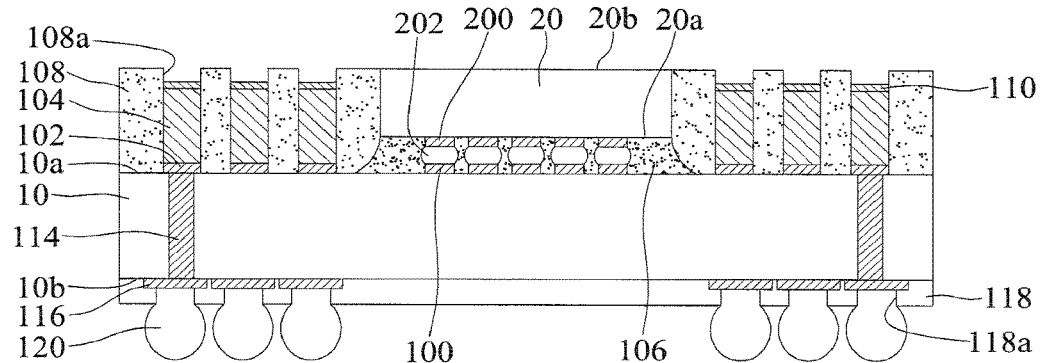

Referring to FIG. 1F, upper portions of the conductive posts 104 are removed such that upper surfaces of the conductive posts 104 are lower than the inactive surface 20b of the chip 20. The removing method can be, but not limited to, etching. Further, a surface processing layer 110 can be formed on the upper surfaces of the conductive posts 104, and a plurality of solder balls 120 can be formed or mounted on the third conductive pads 116 in the openings 118a of the solder mask layer 118.

Figure 1G:
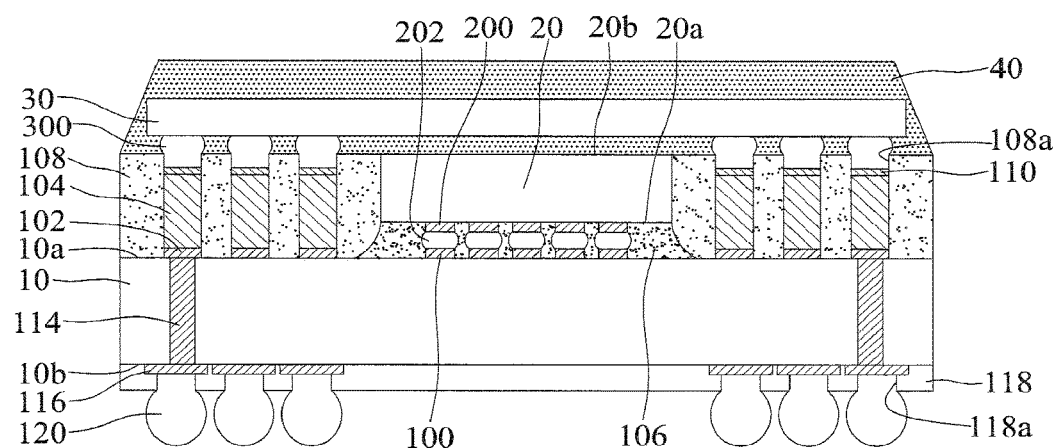
Figure 1F:
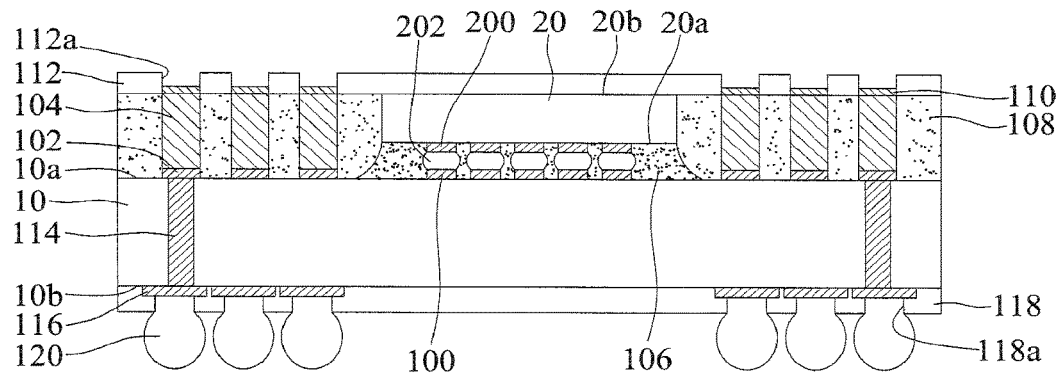
Figure 1G:
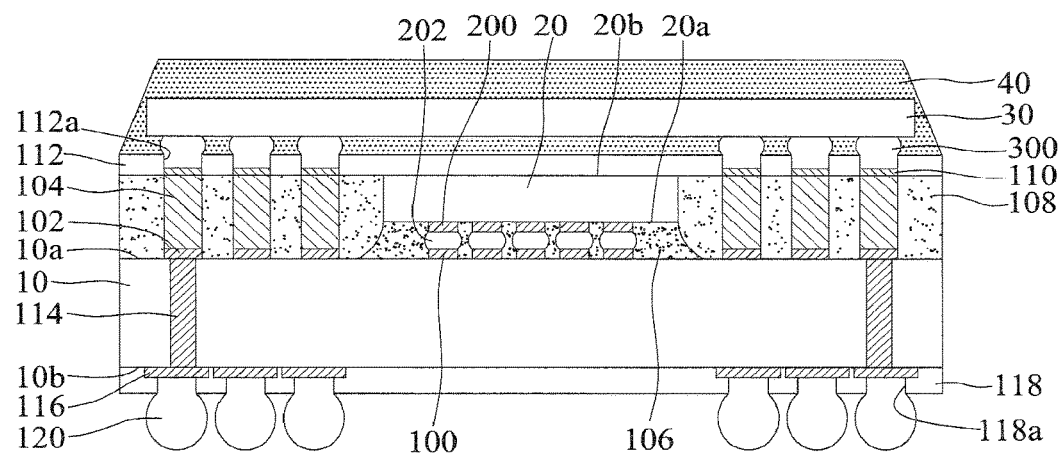

Referring to FIG. 1G, an electronic element 30 is disposed on the conductive posts 104 and electrically connected to the conductive posts 104 through a plurality of conductive elements 300 thereof. Then, a second encapsulant 40 is formed on the first encapsulant 108 for encapsulating the electronic element 30.

FIGS. 1F' and 1G' show another embodiment of FIGS. 1F and 1G. The present embodiment differs from the above-described embodiment in that the upper surfaces of the conductive posts 104 are flush with the inactive surface 20b of the chip 20.

Referring to FIGS. 1F' and 1G', a surface processing layer 110 is formed on the upper surfaces of the conductive posts 104 first and then an insulating layer 112 is formed on the inactive surface 20b of the chip 20 and the first encapsulant 108 and has a plurality of openings 112a for exposing the conductive posts 104. In an alternative embodiment, the insulating layer 112 can be formed before the surface processing layer 110 is formed on the upper surfaces of the conductive posts 104. Thereafter, an electronic element 30 is disposed on the conductive posts 104 and a second encapsulant 40 is formed on the insulating layer 112 for encapsulating the electronic element 30, thus forming a semiconductor package of FIG. 1G'.

FIGS. 1D" and 1G" are schematic cross-sectional views showing a further embodiment of FIGS. 1D and 1G. In the present embodiment, the upper surfaces of the conductive posts 104 and the first encapsulant 108 are higher than the inactive surface 20b of the chip 10, and the upper surface of the first encapsulant 108 has a plurality of openings 108a for exposing the upper surfaces of the conductive posts 104.

Referring to FIG. 1D", after the first encapsulant 108 is formed as in FIG. 1D, a plurality of openings 108a are formed in the first encapsulant 108 for exposing the upper surfaces of the conductive posts 104. Thereafter, a surface processing layer 110 is formed on the upper surfaces of the conductive posts 104. Then, an electronic element 30 is disposed on the conductive posts 104 as in FIG. 1G and a second encapsulant 40 is formed on the first encapsulant 108 for encapsulating the electronic element 30, thus forming a semiconductor package of FIG. 1G". In addition, an insulating layer (not shown) can be formed on the first encapsulant 108 and have a plurality of openings for exposing the upper surfaces of the conductive posts 104. As such, the second encapsulant 40 is formed on the insulating layer.

Referring to FIG. 1G, the semiconductor package of the present invention includes a packaging substrate 10 having opposite first and second surfaces 10a, 10b and a plurality of first and second conductive pads 100, 102 formed on the first surface 10a; a chip 20 having opposite active and inactive surfaces 20a, 20b and disposed on the first conductive pads 100 via the active surface 20a thereof; a plurality of conductive posts 104 formed on the second conductive pads 102, respectively; and a first encapsulant 108 formed on the first surface 10a of the packaging substrate 10 for encapsulating the chip 20 and the conductive posts 104 and having a plurality of openings 108a for exposing upper surfaces of the conductive posts 104.

In an embodiment, the first conductive pads 100 and the second conductive pads 102 are embedded in and exposed from the first surface 10a of the packaging substrate 10.

In an embodiment, the packaging substrate 10 further includes a plurality of third conductive pads 116 formed on the second surface 10b of the packaging substrate 10, and a plurality of conductive through holes 114 formed between the second conductive pads 102 and the third conductive pads 116 and penetrating the packaging substrate 10 for electrically connecting the second conductive pads 102 and the third conductive pads 116. In an embodiment, the third conductive pads 116 are embedded in and exposed from the second surface 10b of the packaging substrate 10. Further, a solder mask layer 118 can be formed on the second surface 10b of the packaging substrate 10 and have a plurality of openings 118a for exposing the third conductive pads 116. Moreover, a plurality of solder balls 120 can be formed or mounted on the third conductive pads 116 in the openings 118a of the solder mask layer 118.

In an embodiment, the active surface 20a of the chip 20 has a plurality of copper bumps 200 with a solder material 202 thereon. The solder material 202 is reflowed to electrically connect the copper bumps 200 of the chip 20 and the first conductive pads 100 of the packaging substrate 10, thereby flip-chip disposing the chip 20 on the first conductive pads 100.

In an embodiment, an underfill 106 is formed between the chip 20 and the packaging substrate 10 for encapsulating the first conductive pads 100, the solder material 202 and the copper bumps 200.

The conductive posts 104 can be made of copper. In the present embodiment of FIG. 1G, the upper surfaces of the conductive posts 104 are lower than the inactive surface 20b of the chip 20. Further, a surface processing layer 110 can be formed on the upper surfaces of the conductive posts 104.

The semiconductor package can further include an electronic element 30 having a plurality of conductive elements 300 formed or mounted thereon. The electronic element 30 can be a semiconductor chip or a package structure. The electronic element 30 is electrically connected to the conductive posts 104 through the conductive elements 300. Further, a second encapsulant 40 can be formed on the first encapsulant 108 for encapsulating the electronic element 30.

In addition, an insulating layer can be formed on the first encapsulant 108 and have a plurality of openings for exposing the upper surfaces of the conductive posts 104. As such, the second encapsulant 40 is formed on the insulating layer.

Referring to FIG. 1G', in the semiconductor package according to another embodiment of the present invention, the upper surfaces of the conductive posts 104 are flush with the inactive surface 20b of the chip 20. An insulating layer 112 is formed on the chip 20 and the first encapsulant 108 and has a plurality of openings 112a for exposing the conductive posts 104. Further, a second encapsulant 40 is formed on the insulating layer 112 for encapsulating the electronic element 30. The insulating layer 112 can be, but not limited to, a solder mask layer. In the present embodiment, a surface processing layer 110 is further formed on the upper surfaces of the conductive posts 104.

Referring to FIG. 1G", in the semiconductor package according to another embodiment of the present invention, the upper surfaces of the conductive posts 104 and the first encapsulant 108 are higher than the inactive surface 20b of the chip 20. In the present embodiment, a surface processing layer 110 is formed on the upper surfaces of the conductive posts 104, and the surface processing layer 110 is flush with or lower than the upper surface of the first encapsulant 108. Further, an insulating layer can be formed on the first encapsulant 108 and have a plurality of openings for exposing the upper surfaces of the conductive posts 104. As such, the second encapsulant 40 is formed on the insulating layer.

Therefore, by forming an encapsulant between the lower packaging substrate and the upper electronic element, the present invention protects the chip and the interconnection structure from being adversely affected by intrusion of moisture. Further, by removing upper portions of the first encapsulant and the conductive posts as well as a portion of the chip to cause the upper surfaces of the first encapsulant and the conductive posts to be flush with the inactive surface of the chip, the present invention reduces the thickness of the semiconductor package. Furthermore, compared with the conventional solder balls, the conductive posts used as the interconnection structure between the packaging substrate and the electronic element have lower height and smaller pitch, thereby reducing the thickness and increasing the I/O density of the semiconductor package.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a semiconductor package, comprising the steps of:
   providing a packaging substrate having opposite first and second surfaces and a plurality of first and second conductive pads formed on the first surface;
   forming a plurality of conductive posts on the second conductive pads, respectively;
   disposing a chip having opposite active and inactive surfaces on the first conductive pads via the active surface thereof,
   after disposing the chip on the first conductive pads, forming a first encapsulant on the first surface of the packaging substrate for simultaneously encapsulating the chip and the conductive posts; and
   removing a portion of the first encapsulant and a portion of each of the conductive posts such that upper surfaces of the first encapsulant and the conductive posts are flush with the inactive surface of the chip, wherein the first encapsulant is in direct contact with the chip;
   after removing the portion of the first encapsulant and the portion of each of the conductive posts to have the upper surfaces of the first encapsulant and conductive posts flush with the inactive surface of the chip, further comprising:
   removing a further portion of each of the conductive posts;
   disposing an electronic element on the conductive posts, wherein the electronic element is electrically connected to the conductive posts through a plurality of conductive elements thereof; and
   forming a second encapsulant on the first encapsulant for encapsulating the electronic element; and
   before disposing the electronic element, further comprising forming a surface processing layer on the upper surfaces of the conductive posts.

2. The method of claim 1, after the upper surface of the first encapsulant and the conductive posts are flush with the inactive surface of the chip, further comprising forming an insulating layer on the chip and the first encapsulant, wherein the insulating layer has a plurality of openings for exposing the conductive posts.

3. The method of claim 1, wherein the electronic element is a semiconductor chip or a package structure.

4. The method of claim 1, wherein the conductive posts are made of copper.

5. The method of claim 1, wherein the packaging substrate further has a plurality of third conductive pads formed on the second surface thereof and a plurality of conductive through holes formed between the second conductive pads and the third conductive pads and penetrating the packaging substrate for electrically connecting the second conductive pads and the third conductive pads.

6. The method of claim 1, before forming the first encapsulant, further comprising forming an underfill between the chip and the packaging substrate.

7. The method of claim 1, wherein removing the portion of the first encapsulant and the portion of the conductive posts further comprises removing a portion of the chip.

8. A method for fabricating a semiconductor package, comprising the steps of:
   providing a packaging substrate having opposite first and second surfaces and a plurality of first and second conductive pads formed on the first surface;
   forming a plurality of conductive posts on the second conductive pads, respectively;

disposing a chip having opposite active and inactive surfaces on the first conductive pads via the active surface thereof, after disposing the chip on the first conductive pads, forming a first encapsulant on the first surface of the packaging substrate for simultaneously encapsulating the chip and the conductive posts, wherein an upper surface of the first encapsulant is flush with the inactive surface of the chip, and the first encapsulant is in direct contact with the chip; and forming a plurality of openings in the first encapsulant for exposing upper surfaces of the conductive posts;

after forming the openings in the first encapsulant, further comprising:

disposing an electronic element on the conductive posts, wherein the electronic element is electrically connected to the conductive posts through a plurality of conductive elements thereof; and forming a second encapsulant on the first encapsulant for encapsulating the electronic element; and before disposing the electronic element, further comprising forming a surface processing layer on the upper surfaces of the conductive posts.

9. The method of claim 8, wherein the electronic element is a semiconductor chip or a package structure.

10. The method of claim 8, wherein the conductive posts are made of copper.

11. The method of claim 8, wherein the packaging substrate further has a plurality of third conductive pads formed on the second surface thereof and a plurality of conductive through holes formed between the second conductive pads and the third conductive pads and penetrating the packaging substrate for electrically connecting the second conductive pads and the third conductive pads.

12. The method of claim 8, before forming the first encapsulant, further comprising forming an underfill between the chip and the packaging substrate.

13. The method of claim 8, before disposing the electronic element, further comprising forming an insulating layer on the first encapsulant, wherein the insulating layer has a plurality of openings for exposing the conductive posts.

* * * * *